(12) United States Patent
Noujeim

(10) Patent No.: US 7,705,582 B2
(45) Date of Patent: Apr. 27, 2010

(54) BROADBAND MICRO-MACHINED THERMAL POWER SENSOR

(75) Inventor: Karam Michael Noujeim, Sunnyvale, CA (US)

(73) Assignee: Anritsu Company, Morgan Hill, CA (US)

( * ) Notice: Subject to any disclaimer, the term of this patent is extended or adjusted under 35 U.S.C. 154(b) by 302 days.

(21) Appl. No.: 11/735,879

(22) Filed: Apr. 16, 2007

(65) Prior Publication Data

US 2008/0252298 A1 Oct. 16, 2008

(51) Int. Cl.
G01R 23/04 (2006.01)
G01R 25/02 (2006.01)
G01N 25/00 (2006.01)
G01J 5/00 (2006.01)

(52) U.S. Cl. .................. 324/95; 324/451; 374/122
(58) Field of Classification Search ............ 324/451, 324/95, 104; 374/122
See application file for complete search history.

(56) References Cited

U.S. PATENT DOCUMENTS

| 4,733,170 | A | * | 3/1988 | McAllister et al. ............ 324/95 |
| 5,291,073 | A | | 3/1994 | Lewandowski |
| 5,370,458 | A | * | 12/1994 | Goff ............................ 374/122 |
| 6,767,129 | B2 | * | 7/2004 | Lee et al. ..................... 374/122 |
| 6,803,754 | B2 | * | 10/2004 | Bratfisch et al. .............. 324/95 |
| 2005/0279398 | A1 | * | 12/2005 | Herrick et al. ............... 136/235 |

OTHER PUBLICATIONS

Volklein, F., et al., "Thermoelectric properties of polysilicon films doped with phosphorus and boron," Sensors and Materials, vol. 3, 1992, pp. 325-334.
Paul, et al., "Determination of the thermal conductivity of CMOS IC polysilicon," Sensors and Actuators, vol. A41, 1994, pp. 161-164.
Gardner, J.W. (Ed.), "Microsensors: Principles and Applications," Wiley, New York, 1994, p. 90.
http://web.archive.org/web/*/http://www.ai.mit.edu/people/tk/tks/silicon-nitride.html, 2 pages dated Dec. 16, 2004.
Petersen, K., "Silicon as a mechanical material," Proceedings of the IEEE, May 1982, pp. 420-446, vol. 70 (5), IEEE, United States of America.
Holman, J.P., "Heat Transfer", McGraw Hill Book Company, 1976, pp. 464-467, New York.

* cited by examiner

*Primary Examiner*—Amy He
(74) *Attorney, Agent, or Firm*—Fliesler Meyer LLP

(57) ABSTRACT

A power sensor includes a substrate, an aperture within the substrate, a membrane formed over at least a portion of the substrate and extending over the aperture, and an electro-thermal transducer partially supported by the insulating membrane. The electro-thermal transducer includes an impedance matched, bifurcated load supported over the aperture by the insulating membrane, and a thermopile extending over the aperture and supported by the insulating membrane, the thermopile being adapted to generate a voltage in response to heat generated in the impedance matched, bifurcated load. A signal conductor is electrically connected with one end of the impedance matched, bifurcated load to guide electromagnetic signals to the load, and a conductive underlayer stratified from the signal conductor by an intermediary dielectric is connected with an opposite end of the impedance matched, bifurcated load to act as a ground plane.

20 Claims, 7 Drawing Sheets

BROADBAND MICRO-MACHINED THERMAL POWER SENSOR

TECHNICAL FIELD

The present invention relates generally to time-harmonic electromagnetic signals and sources, and more specifically to sensors for measuring the time-average power transported by time-harmonic electromagnetic signals originating from such sources.

Numerous techniques exist for measuring the time-average power transported by a time-harmonic electromagnetic signal. Of these techniques, those that are based on the use of thermistors, diodes, and thermopiles (also referred to as Seebeck-Effect sensors) are the most common. Thermistors have traditionally been used for standards transfer and are not used for normal measurements on systems and equipment because of their limited power-handling capability. Diode-based sensors are available in several different formats, namely square-law-only sensors, linearity-corrected wide-dynamic-range sensors, and multiple-diode-based sensors. In very-wide-dynamic-range sensors, readings above −20 dBm must generally be corrected to compensate for diode nonlinearity. In addition, the sensor output varies with frequency and temperature as well as input-signal level, thus making power measurements with a diode sensor quite complex. Calibration tables referenced to a temperature sensor are often used to correct the output under a large number of operating conditions, adding considerable complexity to diode-sensor correction above −20 dBm.

Thermopile sensors comprise electro-thermal transducers that are based on the Seebeck principle in which an electric potential is set up due to the presence of a thermal gradient across opposite junctions of a thermopile. The thermal gradient results from the localized heating effect of the time-harmonic electromagnetic signal. The power transported by an incoming signal is absorbed by a small dummy load within the electro-thermal transducer. As an example, a common electro-thermal transducer may employ a 50-$\Omega$ thin-film or chip resistor (e.g. an 0603 resistor) to absorb electromagnetic signals within a frequency range from DC to 10 GHz. Electromagnetic-signal power dissipated in the dummy load causes it to heat up. The observed change in temperature across opposite junctions of the thermopile causes an electric potential to develop and can be used to determine the power transported by the electromagnetic signal. Thermopile sensors are well-suited for measuring the time-average power or true root-mean-square (RMS) power of complex waveforms such as quadrature amplitude modulation (NQAM) as the thermopile sensor will always respond to the true RMS value of the input waveform regardless of the modulation imposed upon the carrier. Further, thermopile sensors are designed to have good return loss, which enhances measurement uncertainty. Existing thermopile-based sensors suffer from a number of disadvantages such as high cost, low sensitivity, low dynamic range, low power handling, limited frequency range, and low precision due in part to sensitivity to ambient, conditions. It is therefore desirable to design a power sensor that includes an electro-thermal transducer which reduces one or more of these disadvantages.

BRIEF DESCRIPTION OF THE DRAWINGS

Further details of embodiments of the present invention are explained with the help of the attached drawings in which.

DETAILED DESCRIPTION OF THE DRAWINGS

Figure 1:
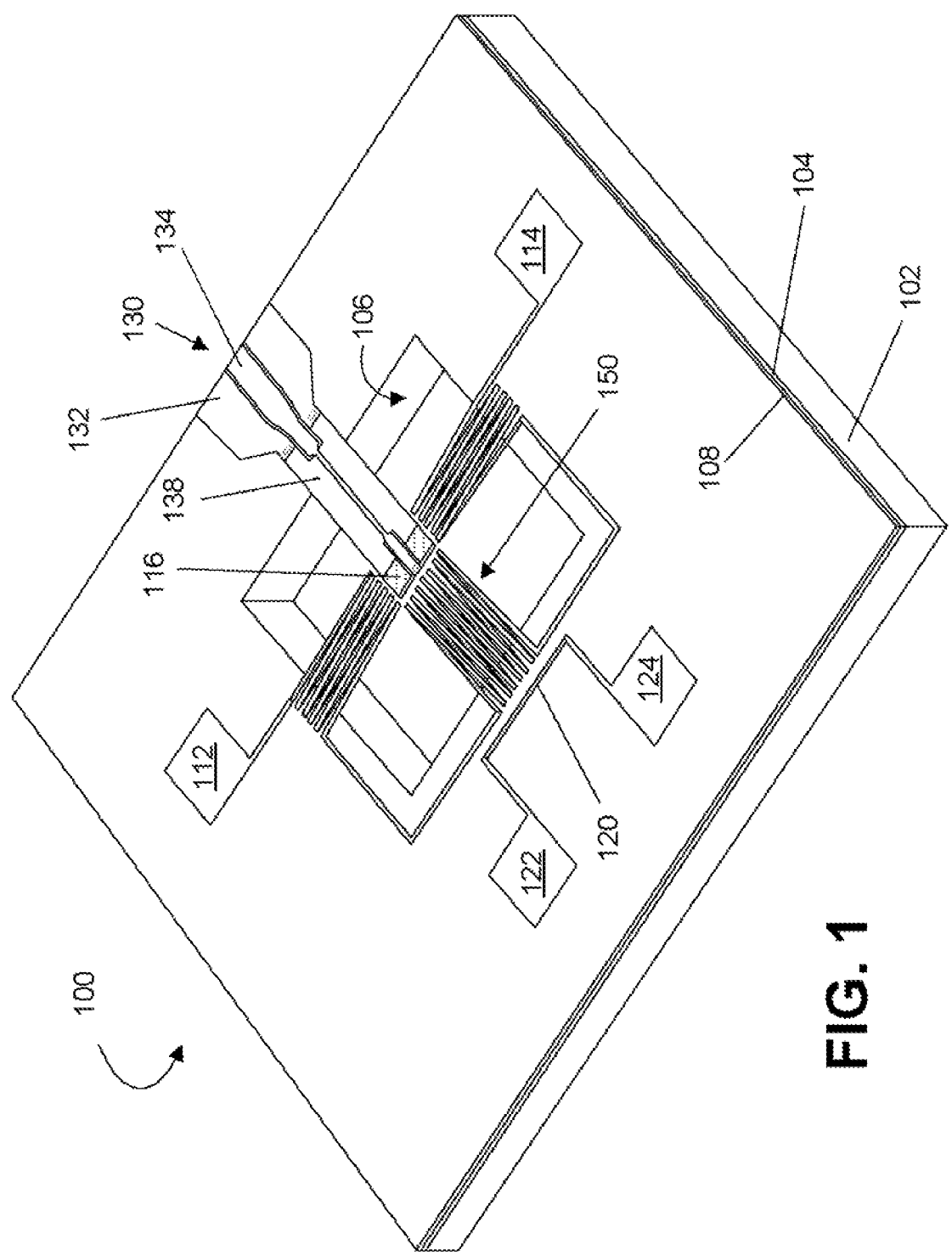
FIG. 1 is a perspective view of an embodiment of a power sensor in accordance with the present invention.
Figure 2:
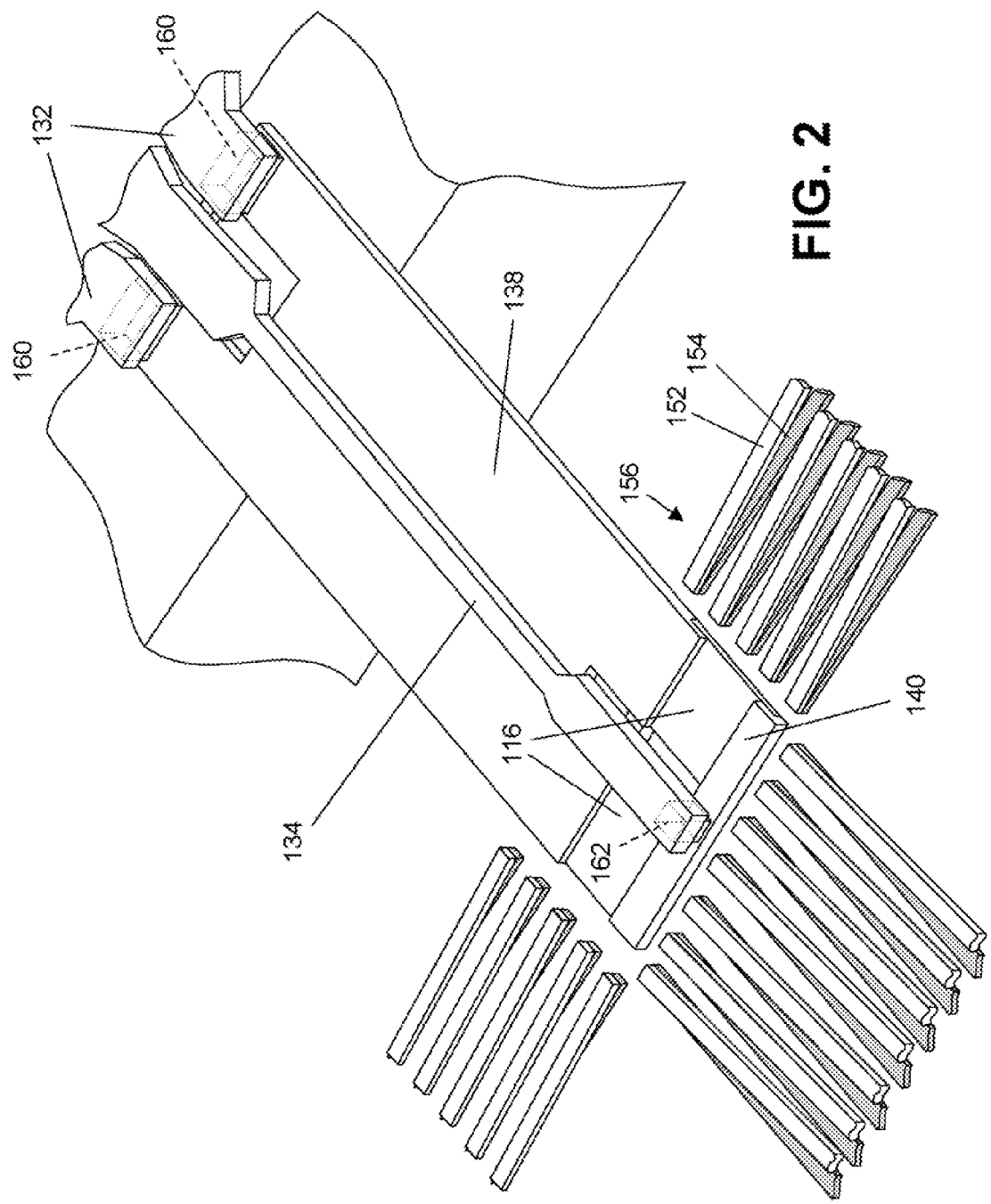
FIG. 2 is a perspective detailed view of an embodiment of an electromagnetic transition for use with the power sensor of FIG. 1.

FIGS. 1 and 2 are perspective views of an embodiment of an electromagnetic transition and a power sensor 100 including the transition in accordance with the present invention. The power sensor 100 comprises a coplanar waveguide launch 130 formed over a BCB (Benzocyclobutene) film residing on substrate 102 and connected with an electro-thermal transducer. The electro-thermal transducer comprises a load 116 supported by a membrane 104 over an aperture 106 within the substrate 102. The load 116 is bifurcated and in a preferred embodiment the load has an impedance of 50 ohm. A 50 ohm load can be fabricated from myriad different materials known in the art, such as for example tantalum nitride or nickel-chromium. However, in other embodiments a load having some other impedance can be used. The impedance of the load is commonly influenced by the source of the electromagnetic signal with which the power sensor 100 interfaces.

The electro-thermal transducer further comprises a thermopile 150 extending at least partially over the aperture and including hot junctions 156 arranged in sufficient proximity to the load 116 to receive a substantial portion of the heat emitted by the load 116. As shown, the thermopile 150 comprises thermocouples 152,154 connected in series and terminating at two terminals 112,114. The thermopile 150 converts heat emitted by the load 116 and received by the thermopile 150 into a DC voltage. The DC voltage is measured and the power delivered to the load is deduced from the measurement. In an embodiment, the thermocouples of the thermopile can include a strip substantially comprising polysilicon 154 connected with a strip substantially comprising gold-coated metal 152. In other embodiments, thermocouples including some other combination of conductive materials can be used. Preferably the thermocouple materials are chosen based on consideration of at least three characteristics of the thermocouple: 1. the difference between the Seebeck coefficients of the materials, 2. the thermal conductivity of the materials, and 3. the electrical conductivity of the materials. One of ordinary skill in the art will appreciate the myriad different combinations of materials with which thermocouples and thermopiles can be formed.

The aperture 106 preferably contains a material or combination of materials having low thermal conductivity. For example, the aperture 106 can contain air or nitrogen, which has a thermal conductivity of approximately 0.0257 W/mK.

Alternatively, the aperture 106 can be a vacuum. Alternatively, the aperture 106 can contain a material having thermal conductivity that, does not approach the thermal conductivity of air (e.g., silicon dioxide, having a thermal conductivity of 1.4 W/mK), but nevertheless has a dielectric constant suitably low for a desired sensitivity of the power sensor 100. Arranging the load 116 over the aperture 106 reduces dissipation into a common thermal mass of the heat converted from the electromagnetic signal entering the load 116, thereby isolating the hot junctions of the thermopile 150 from the cold junctions of the thermopile 150 to maximize a gradient between the hot and cold junctions. A high thermal gradient between the hot and cold junctions can result in a high voltage across the terminals 112,114 of the thermopile 150. Dissipation of heat across the thermopile 150 contributes noise to a measurement of the heat emitted by the load 116, for example by reducing the gradient between the hot and cold junctions, thereby reducing sensitivity of the power sensor 100. It can therefore be beneficial to reduce thermal conductivity (and electrical conductivity) between the load 116 and the rest of the electrothermal transducer. The lateral dimensions of the aperture 106 (and the length of the strips of the thermocouples) affect the thermal rise-time of the power sensor 100. Large footprint apertures result in large thermal rise-times (i.e., "slow" power sensors) that have high-sensitivity. Contrariwise, small footprint apertures result in small thermal rise-times (i.e., "fast" power sensors) at the expense of reduced sensitivity. A compromise is made between the rise time and sensitivity to suit the needs and desires of an application.

The membrane 104 supporting the load 116 over the aperture 106 can optionally extend over the substrate 102 so that the structures in electrical communication with one another are fabricated on top of the membrane 104. The membrane 104 includes a thickness that is sufficient to support structures extending over the aperture 106 without, deformation or unacceptable stress within the membrane 104. However, the membrane 104 is preferably as thin as possible to reduce noise contribution of the membrane 104 to the thermopile 150. For example, the membrane 104 can be approximately a micron in thickness.

A thermometer 120 or other dynamic reference structure can improve a determination of power based on the measured DC voltage by enabling compensation for the influence of substrate temperature on the DC signal produced by the thermopile 150. In the embodiment of FIG. 1, the thermometer 120 is positioned in close proximity with the thermopile 150 such that the thermopile 150 cannot communicate or be influenced by the thermometer 120, but the temperature of the substrate 102 on which the cold junctions of the thermopile 150 is disposed is measured as closely as is practicable. In an embodiment, the temperature sensor 120 can comprise a polysilicon resistor connected between two gold-coated terminals 122,124. A change in substrate temperature can affect the temperature gradient of the thermopile 150 by changing the temperature of the cold junctions. A change in resistance of the resistor 120 as a result of the change in substrate temperature is therefore correlated with the effect of substrate temperature on the temperature gradient.

The signal conductor 134 and ground conductors 132 extend to the load 116 from the coplanar waveguide launch 130. If the signal conductors 134 and ground conductors 132 are arranged coplanar as they cross from over the silicon substrate 102 to over the aperture 106, substantial capacitive charging can occur. As capacitive charging increases, reflectivity increases. In order to reduce the amplitude of the reflected electromagnetic signal, an embodiment of a transition in accordance with the present invention can extend approximately between the waveguide launch 130 and the load 116. The transition can reduce reflection by isolating the signal conductor 134 from the ground conductors 132. In an embodiment improved isolation is achieved by connecting the ground conductors 132 extending from the coplanar waveguide launch 130 with a conductive under-layer 138 by way of vias 160. The conductive under-layer 138 and vias 160 can comprise the same material as the ground conductors 132, for example gold-coated metal, or some other conductive material having similar impedance. The via 160 connects the ground conductors 132 to the conductive under-layer 138 through a dielectric material such as benzocyclobutene (BCB), which acts as an intermediary dielectric 108 between the signal conductor 134 and the conductive under-layer 138.

As shown, the load 116 and conductive under-layer 138 are formed on the membrane 104, and the conductive under-layer 138 is electrically connected with the proximal edge of the load 116. The conductive under-layer 138 is forked to connect with the bifurcated load 116. An underpass 139 connected between the prongs of the fork maintains phase coherence of the electromagnetic signal that is propagating. A conductor strip 140 supported by the membrane 104 extends along the distal edge of the load 116, contacting both portions of the load 116. The conductor strip 140 electrically communicates with the signal conductor 134. The intermediary dielectric 108 is formed over the conductive under-layer 138, the load 116, and the conductor strip 140 structures. The vias 160 are formed through the intermediary dielectric 108 at a proximal end of the transition to expose a proximal end of the conductive under-layer 138. Further, a via 162 is formed at the distal end of the transition to expose the conductor strip 140 through the intermediary dielectric 108.

Referring particularly to FIG. 2, the transition is shown with the intermediary dielectric removed from view to better show the underlying structures. The ground conductors 132 of the coplanar waveguide launch 130 terminate approximately over the vias (not shown), and electrically communicate with the conductive under-layer 138 by way of the vias. The signal conductor 134 extends over the conductive under-layer 138 from the coplanar waveguide launch 130 to a distal end of the transition with the intermediary dielectric 108 arranged between the signal conductor 134 and the conductive under-layer 138. The signal conductor 134 acts as a quasi-thin film microstrip as arranged over the conductive under-layer 138. The signal conductor 134 electrically communicates with the conductor strip 140 by way of the via through which the conductor strip 140 is exposed. The intermediary dielectric 108 can sufficiently isolate the signal conductor 134 from the ground conductors 132 to limit capacitive charging where the electromagnetic signal travels over mediums including a very large change in dielectric constant between the mediums. The intermediary dielectric 108 resists capacitive charging between the signal conductor 134 and the ground conductors 132 which would result in high reflectivity of electromagnetic signals. The signal conductor 134 and conductive under-layer 138 communicate with the load 116 and act as a quasi-coplanar waveguide.

Increased reflectivity inherent in a structure limits a usable bandwidth of electromagnetic signal. Use of embodiments of transitions in accordance with the present invention can increase a usable bandwidth of a device in which capacitive charging can otherwise occur. As described in detail herein, the transition can increase a usable bandwidth for the electro-thermal transducer (and therefore for the power sensor), but it should be noted that embodiments of transitions in accordance with the present invention can be employed in other devices and applications to likewise reduce capacitive charging.

An embodiment of a method for fabricating transitions and power sensors including such transition in accordance with the present invention is shown by way of progressive stages of fabrication in the cross-sectional views of FIGS. 3A through 3E. In the embodiment shown, the transition and power sensor can be formed using complementary metal oxide semiconductor (CMOS) processing, in other embodiments other types of thin film processing can be applied to fabricate transitions and power sensors formed of the same or different materials. One of ordinary skill in the art will appreciate in view of the present teachings the myriad different materials and fabrication steps that can be employed to form such structures.

Figure 3A:
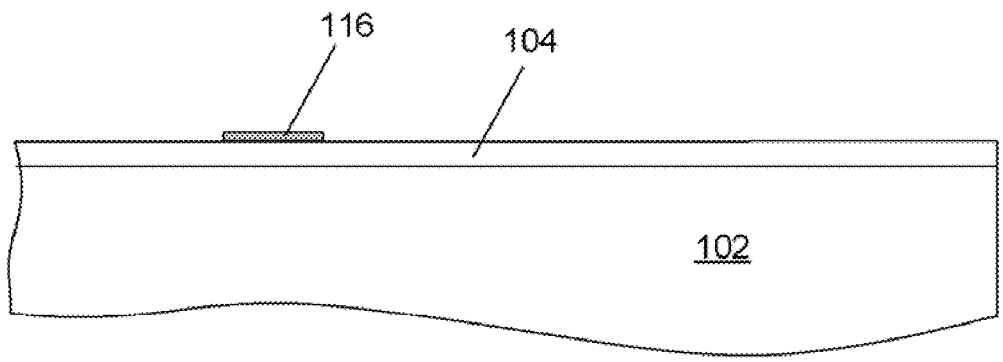
FIGS. 3A-3E are cross-sectional views of the embodiment of an electromagnetic transition for a power sensor of FIGS. 1 and 2 in progressive stages of fabrication.

Referring to FIG. 3A, a membrane 104 is shown formed over a silicon substrate 102. The membrane 104 can comprise silicon dioxide ($SiO_2$), for example, or some other dielectric, such as borophosphosilicate glass (BPSG) or silicon nitride ($Si_3N_4$). The membrane can be formed by thermal diffusion, low-pressure chemical vapor deposition, or some other process. As discussed above, the membrane thickness can vary, and should be sufficient to support the electro-thermal transducer over the aperture 106 without an undesirable amount of deformation or stress. A load material is subsequently deposited over the membrane 104 layer, and the wafer is patterned and etched to define the load 116. A 50 ohm load can be fabricated from myriad different-materials known in the art, such as for example tantalum nitride or nickel-chromium. Loads having some other impedance may be fabricated from other materials.

Figure 3B:
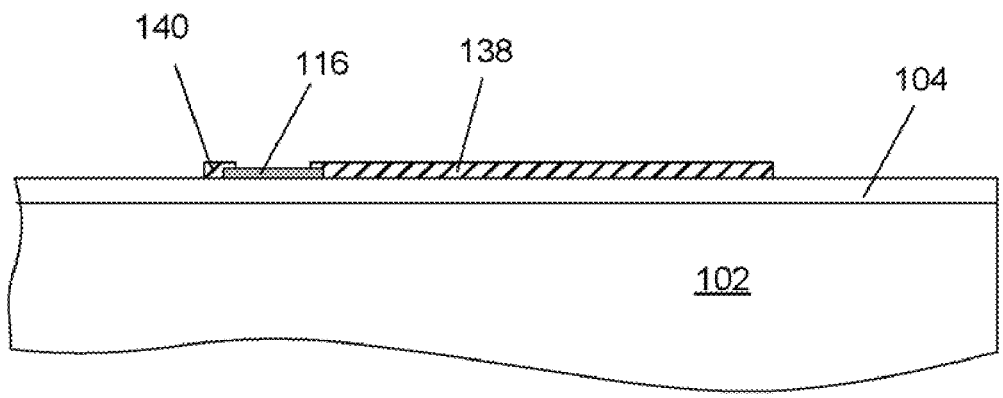

Referring to FIG. 3B, a conductive under-layer 138 and conductor strip 140 can be formed by depositing a layer of conductive material over the membrane 104 and load 116. The conductive material can comprise gold, or it can comprise some other material or combination of materials. For example, the conductive material can comprise a composite layer including a metal, coated with gold. The layer of conductive material is patterned and etched to define the conductive under-layer 138 and the conductor strip 140, which overlap the proximal and distal ends of the load 116, respectively.

Figure 3C:
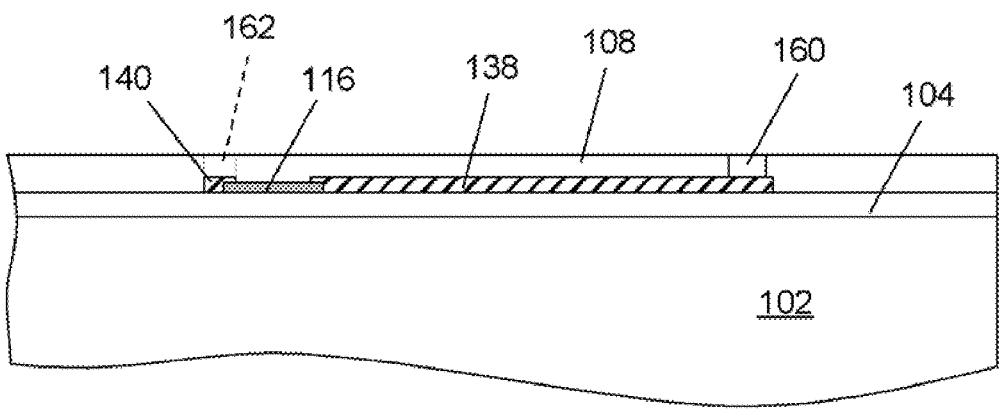

Referring to FIG. 3C, an intermediary dielectric 108 is shown formed over the load 116, the conductive under-layer 138, and the conductor strip 140. As mentioned above, the intermediary dielectric 108 can comprise BCB, or some other material that is similarly conformal when formed over the existing structures. For example, the intermediary dielectric 108 can alternatively comprise spin-on-glass (SOG) or polyimide. Via structures 160,162 are patterned and etched to expose portions of the conductive under-layer 138 and the conductor strip 140. The vias 160,162 can then be plugged (i.e. lined and/or filled), for example with titanium nitride (TiN), or some other conductive material. Excess material can be removed from the surface. Alternatively, the vias 160,162 can be filled during the formation of an additional conductive layer for defining the signal conductor 134 and ground conductors 132.

Figure 3D:
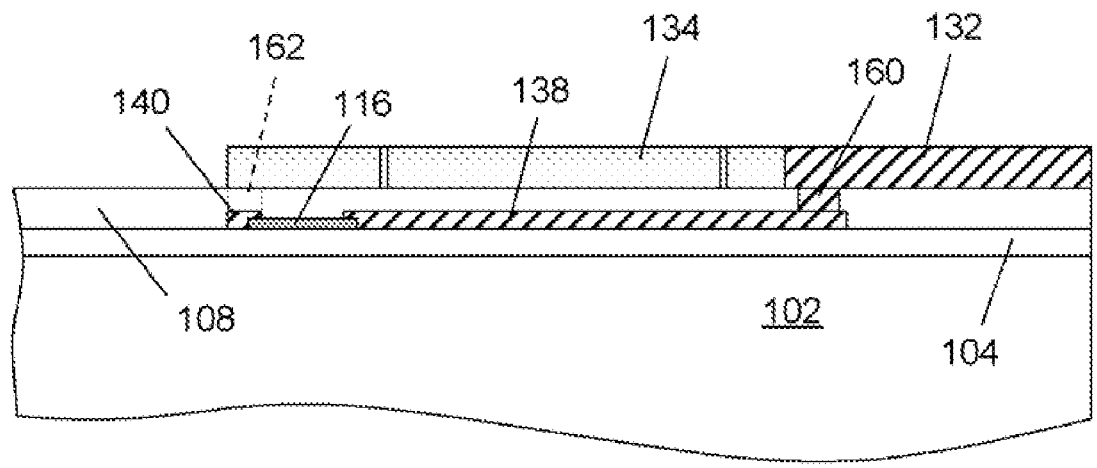
Figure 3E:
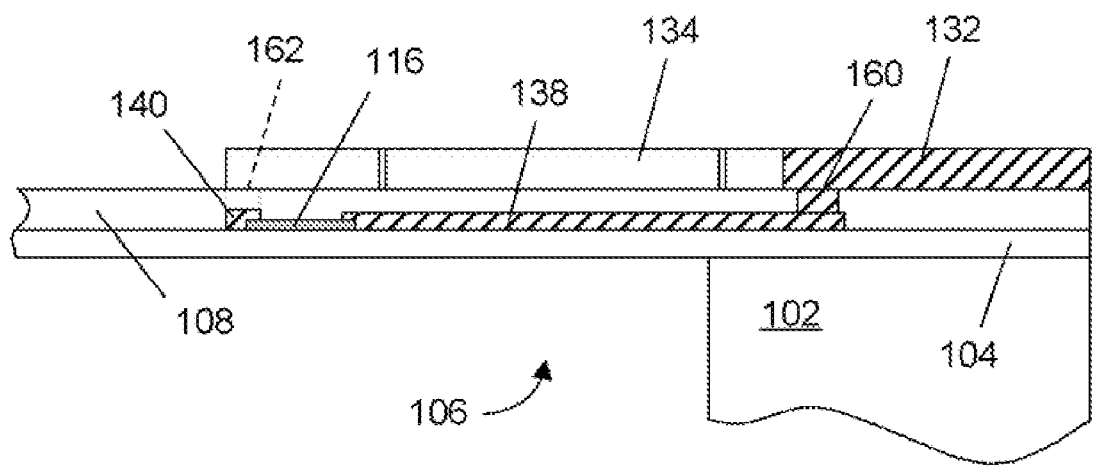

Referring to FIG. 3D, an additional layer of conductive material is formed over the intermediary dielectric 108 so that the conductive material contacts and/or fills the vias 160,162, and is in electrical communication with the conductive under-layer 138 and the conductor strip 140. The additional layer can then be patterned and etched to define the ground conductors 132 connected with the coplanar waveguide launch and the signal conductor 134, which extends to a distal end of the transition so that the signal conductor 134 is in electrical communication with the conductor strip 140. The silicon substrate 102 can be back-etched to form the aperture. A back-etch process can be performed having high selectivity to the membrane 104, preventing damage to the membrane 104 and the structures formed over the membrane 104.

As can be seen, the intermediary dielectric 108 spaces the signal conductor 134 from the conductive under-layer 138, which is in electrical communication with the ground conductor 132. The intermediary dielectric 108 limits capacitive charging that can occur when conductive structures transition from the silicon 102 to the aperture 106. Reflectivity of electromagnetic signals are thereby reduced, while the power sensor 100 is allowed the benefit of a load 116 isolated from a large thermal mass by enabling arrangement of the load 116 over the aperture 106.

It should be noted that while FIGS. 3A through 3E illustrate with particularity an embodiment of a method for fabricating transitions and power sensors comprising such transitions in accordance with the present invention, the power sensor structures can vary in size and shape, and are not necessarily drawn to appropriate dimensions of thickness and footprint. It will occur to one of ordinary skill in the art in light of the present teachings that myriad variations in process techniques, step order, materials and structure geometry can be employed to achieve transitions and power sensors in accordance with the present invention. As just one example, the signal conductor 134 and ground conductors 132 could alternatively be fabricated by way of a damascene process, wherein the conductor structures and vias are defined by patterning and etching within a deposited dielectric and the conductor structures and vias are subsequently filled with conductive material.

The present invention is meant to encompass transitions including an intermediary dielectric arranged between a signal conductor and other conductive paths to reduce capacitive charging, and power sensors comprising such transitions and isolating hot and cold junctions of a thermopile through use of an aperture, and methods employing all such techniques, step order, materials and structure geometry for forming such transitions and power sensors comprising such transitions.

Figure 4A:
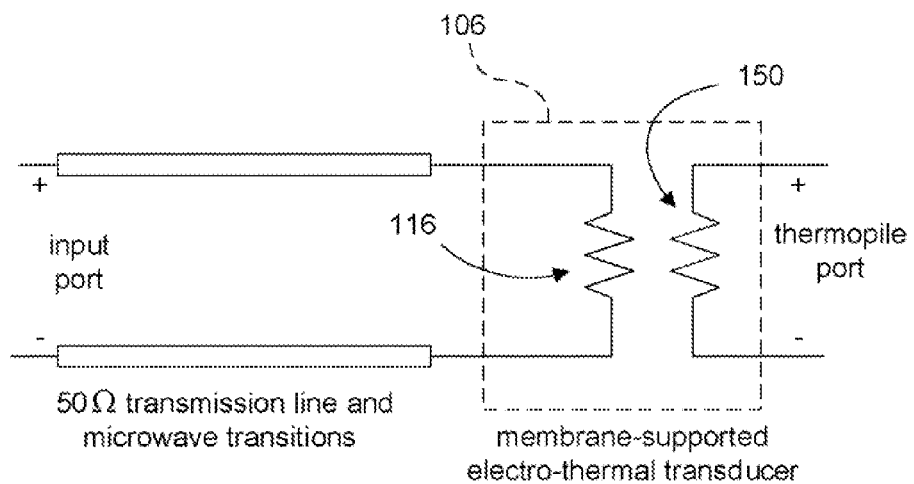
FIG. 4A is an equivalent circuit of a portion of the power sensor of FIG. 1.

FIG. 4A is an equivalent circuit for an embodiment of a power sensing device including a power sensor as shown in FIGS. 1 and 2. A microwave source, for example, can be connected with the power sensing device at an input port, and microwaves can be guided to the load 116 supported over the aperture 106. The load 116 is represented as a resistor. Heat emitted by the load 116 creates a temperature gradient across the thermopile 150, generating a DC voltage. Embodiments of transitions in accordance with the present invention reduce capacitive charging, allowing the conductors to be modeled in the equivalent circuit as a 50Ω transmission line.

Figure 4B:
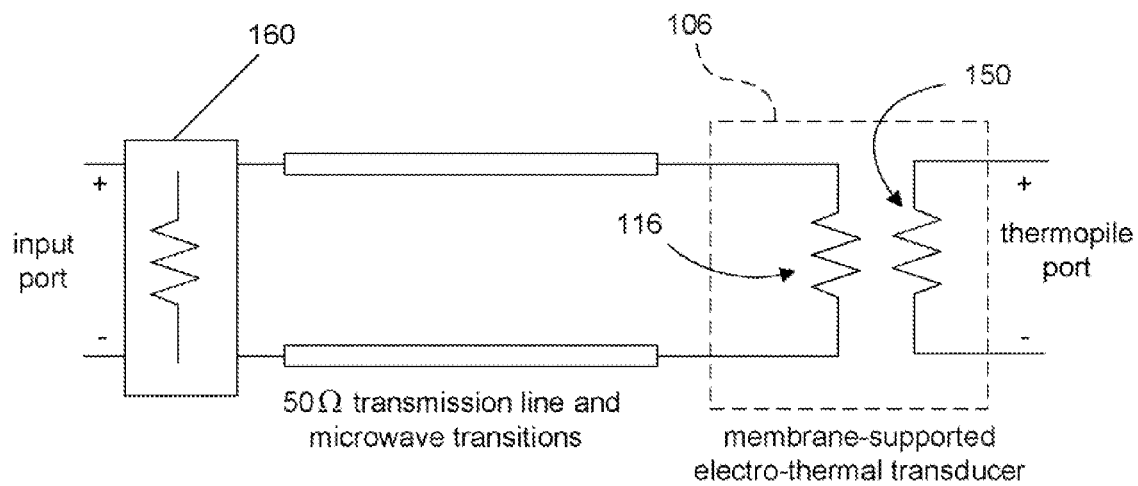
FIG. 4B is an equivalent circuit of an alternative embodiment of a power sensor in accordance with the present invention including an attenuator connected between a port and an electro-thermal transducer of the power sensor.

An electro-thermal transducer supported on a membrane 104 has a reduced amount of heat dissipation relative to an electro-thermal transducer supported on a thermal mass such as silicon. Therefore, it can be desirable to reduce the power of an electromagnetic signal source where the electromagnetic signal source is a high power source. Referring to FIG. 4B, the equivalent circuit of FIG. 4A is shown further comprising an attenuator 160 arranged in series with a microwave source and an electro-thermal transducer. The attenuator 160 can be, for example, a pi or T network, or some other structure that can reduce power but that preserves the value of load impedance seen by the source. The attenuator can be integrally formed with the power sensor structure shown in FIGS. 1-4A, or alternatively can be external to the power sensor and connected between the power sensor and the microwave source. Where the attenuator 160 is integrally formed with the power sensor, the attenuator 160 can have any topology that can be implemented in thin film processing.

Figure 4C:
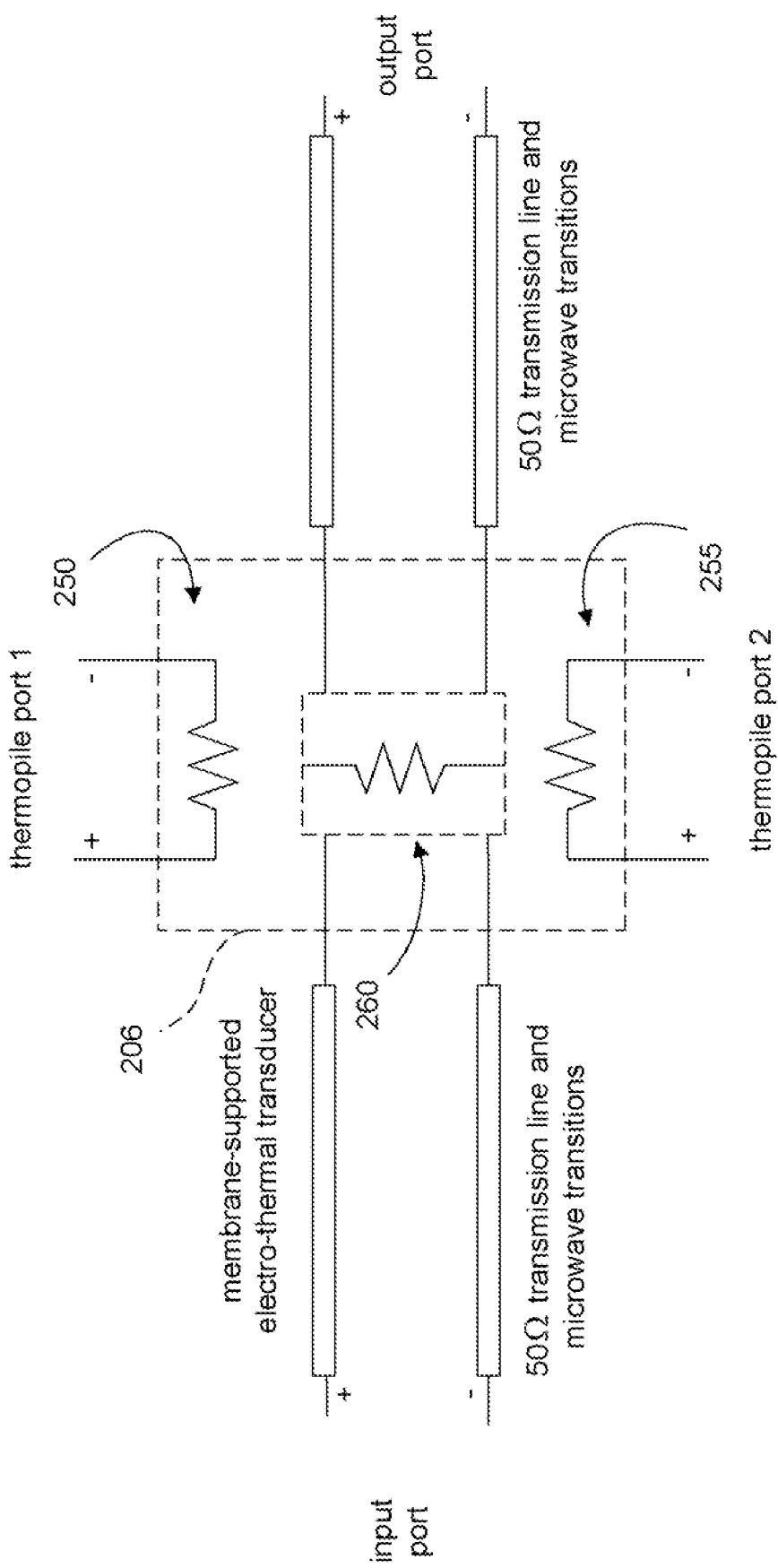
FIG. 4C is an equivalent circuit of a still further embodiment of a power sensor in accordance with the present invention including an electro-thermal transducer comprising an inline attenuator.

Referring to FIG. 4C, an alternative embodiment of a power sensor in accordance with the present invention is shown. An electro-thermal transducer of the power sensor comprises an attenuator 260 arranged between an input port for a microwave source and an output port, and supported by a membrane (not shown) over an aperture 206. The attenuator 260 supplants the load 116 of FIG. 4C and connects with the input and output transmission lines by way of transitions separating conductive paths, as described above. Two thermopiles 250,255 are arranged over the aperture 206, with one thermopile on each side of the attenuator 260 to receive heat emitted by the attenuator 260 from power removed from the attenuator 260. Heat emitted by the in-line, membrane supported attenuator 260 generates a DC voltage across the thermopiles 250,255. Alternatively, a single thermopile can be fabricated, for example by spanning the thermopile over the attenuator. The arrangement of FIG. 4C can guide unattenuated electromagnetic signals to the electro-thermal transducer (where electromagnetic signals are then attenuated) without a risk of breaking down the heat generating structures, which comprise the attenuator 260 itself.

Figure 4D:
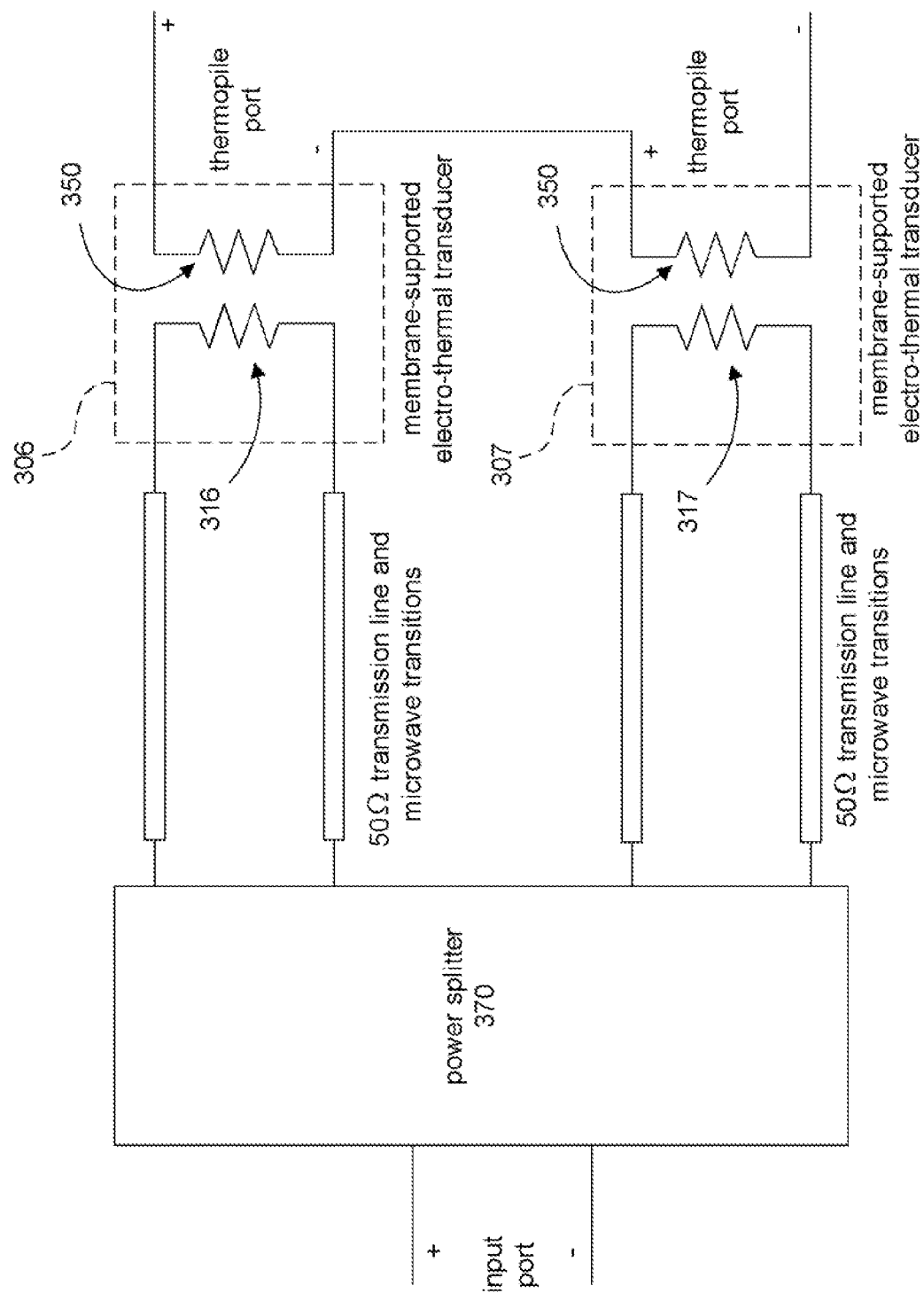
FIG. 4D is an equivalent circuit of a further embodiment of a power sensor in accordance with the present invention including a power splitter for guiding electromagnetic signals to two loads.

Referring to FIG. 4D, a still further embodiment of a power sensor in accordance with the present invention is shown. The power of electromagnetic signals that is received by a load can alternatively be reduced by dividing the electromagnetic signal power by way of a power splitter 370 fabricated on the power sensor or externally connected with the power sensor. The electromagnetic signals can be guided to two loads 316, 317 arranged over separate apertures 306,307. A common thermopile 350 including thermocouples connected in series provides a cumulative DC voltage from heat generated by both loads 316,317. The power splitter 370 distributes heat associated with the power across multiple loads 316,317 to reduce a maximum heat generated in a load 316,317, thereby resisting breakdown of the material with which the load is formed. The power splitter 370 is shown dividing the power across two electro-thermal transducers, but alternatively could divide the power across many electro-thermal transducers, for example three, four, five, or more electro-thermal transducers.

The equivalent circuits of FIGS. 4A-4D are provided merely as embodiments of power sensors in accordance with the present invention The present invention is not intended to be limited by those embodiments described herein with particularity. One of ordinary skill in the art will appreciate in light of these teachings the myriad different arrangements of electro-thermal transducers and transitions that can be applied to form power sensors and other structures in accordance with the present invention.

The foregoing description of the present invention has been presented for purposes of illustration and description. It is not intended to be exhaustive or to limit the invention to the precise forms disclosed. Many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

The invention claimed is:

1. A broadband power sensor comprising:
   a substrate;
   an aperture within the substrate;
   a membrane formed over at least a portion of the substrate and extending over the aperture;
   a coplanar waveguide (CPW) launch positioned over the substrate and including a pair of ground conductors terminating over the substrate and a signal conductor extending from the substrate over at least a portion of the aperture;
   a conductive under-layer positioned partially over the substrate and supported partially over the aperture by the membrane, wherein the conductive under-layer and the signal conductor are stratified by an intermediary dielectric;
   a transition formed on the substrate including a pair of vias extending through the intermediary dielectric and connecting the pair of ground conductors with the conductive under-layer;
   an electro-thermal transducer partially supported by the membrane, the electro-thermal transducer including:
      an impedance matched, bifurcated load formed over the aperture and supported over the aperture by the membrane, the bifurcated load having a width extending substantially the width of the conductive under-layer, wherein the conductive under-layer is forked so that one prong of the conductive under-layer is connected to a proximal end of one portion of the bifurcated load and the other prong of the conductive under-layer is connected to a proximal end of the other portion of the bifurcated load,
      an underpass connecting the proximal ends of the portions of the bifurcated load to maintain phase coherence of a propagated signal,
      a conductor strip having a width extending substantially the width of the bifurcated load, the conductor strip being connected with the distal end of the bifurcated load, and spanning a gap between the portions of the bifurcated load, and
      a thermopile extending over the aperture and supported by the membrane, the thermopile being adapted to generate a voltage in response to heat generated in the impedance matched, bifurcated load;
   wherein the signal conductor is connected with the conductor strip by a via extending through the intermediary dielectric to guide electromagnetic signals to the bifurcated load; and
   a thermometer arranged over the substrate to measure a temperature of the substrate.

2. The broadband power sensor of claim 1, further comprising:
   a first thermopile terminal arranged on the substrate and connected with the thermopile; and
   a second thermopile terminal arranged on the substrate and connected with the thermopile.

3. The broadband power sensor of claim 1, wherein the thermometer includes a resistor disposed between a first terminal and a second terminal.

4. The broadband power sensor of claim 1, wherein:
   the membrane is one or both of silicon nitride and silicon dioxide; and
   the thermopile comprises a plurality of polysilicon and gold-plated metal thermocouples connected in series.

5. The broadband power sensor of claim 1, further comprising:
   a port; and
   an attenuator connected between the port and the coplanar-waveguide input.

6. The broadband power sensor of claim 1, wherein the aperture includes one of air, nitrogen and vacuum.

7. The broadband power sensor of claim 1, wherein the intermediary dielectric comprises benzocyclobutene (BCB).

8. The broadband power sensor of claim 1, wherein an electrical path including the pair of ground conductors and the conductive under-layer has substantially the same electrical length as an electrical path including the signal conductor and conductor strip, thereby reducing phase lag.

9. A broadband power sensor comprising:
   a substrate;
   an aperture within the substrate;
   a membrane extending over the aperture;
   a conductive under-layer positioned partially over the substrate and supported over the aperture by the membrane;
   a signal conductor extending over at least a portion of the aperture, wherein the conductive under-layer and the signal conductor are stratified by an intermediary dielectric; and
   an electro-thermal transducer including:
      an impedance matched, bifurcated load supported over the aperture by the membrane,
      wherein the conductive under-layer is connected to a proximal end of one portion of the bifurcated load and a proximal end of the other portion of the bifurcated load,
      a conductor strip connected with the distal end of the bifurcated load and extending between the portions of the bifurcated load, and
      a thermopile at least partially supported over the aperture by the membrane, the thermopile being adapted to generate a voltage in response to heat generated in the bifurcated load;
   wherein the signal conductor is connected with the conductor strip by a via extending through the intermediary dielectric to guide electromagnetic signals to the bifurcated load.

10. The broadband power sensor of claim 9, further comprising:
   a coplanar waveguide (CPW) launch positioned over the substrate and including a portion of the signal conductor, and a pair of ground conductors terminating over the substrate; and
   a transition formed over the substrate including a pair of vias extending through the intermediary dielectric and connecting the pair of ground conductors with the conductive under-layer.

11. The broadband power sensor of claim 10, wherein an electrical path including the pair of ground conductors and the conductive under-layer has substantially the same electrical length as an electrical path including the signal conductor and conductor strip, thereby reducing phase lag.

12. The power sensor of claim 10, further comprising:
   a port; and
   an attenuator connected between the port and the CPW.

13. The broadband power sensor of claim 9, further comprising:
   an underpass connecting the proximal ends of the portions of the bifurcated load to maintain phase coherence of a propagated signal; and
   wherein the conductive under-layer is forked so that one prong of the conductive under-layer is connected to a proximal end of one portion of the bifurcated load and the other prong of the conductive under-layer is connected to a proximal end of the other portion of the bifurcated load.

14. The broadband power sensor of claim 9, wherein the intermediary dielectric comprises benzocyclobutene (BCB).

15. The broadband power sensor of claim 9, wherein the electro-thermal transducer further includes a first thermopile terminal and a second thermopile terminal, the thermopile terminals being arranged over the substrate.

16. The broadband power sensor of claim 9, further comprising a thermometer arranged over the substrate including a resistor disposed between a first terminal and a second terminal.

17. The broadband power sensor of claim 9, wherein the membrane is one or more of silicon nitride, borophosphosilicate glass and silicon dioxide.

18. The broadband power sensor of claim 9, wherein the membrane extends over the substrate such that the thermopile is wholly supported by the membrane.

19. The broadband power sensor of claim 9, wherein the thermopile comprises a plurality of polysilicon and gold-plated metal thermocouples connected in series.

20. The broadband power sensor of claim 9, wherein the aperture includes one of air, nitrogen and vacuum.

* * * * *